United States Patent [19]

Ito

[11] Patent Number: 5,100,526
[45] Date of Patent: Mar. 31, 1992

[54] APPARATUS FOR FORMING THIN FILM

[75] Inventor: Hiroki Ito, Amagasaki, Japan

[73] Assignee: Mitsubishi Denki Kabushiki Kaisha, Japan

[21] Appl. No.: 645,414

[22] Filed: Jan. 24, 1991

[30] Foreign Application Priority Data

Jun. 18, 1990 [JP] Japan .................. 2-160270

[51] Int. Cl.⁵ .............................................. C23C 14/22
[52] U.S. Cl. ................................. 204/298.05; 118/723
[58] Field of Search ...................... 204/192.31, 298.05; 118/723

[56] References Cited

U.S. PATENT DOCUMENTS

| | | | |
|---|---|---|---|
| 3,847,115 | 11/1974 | Tashbar | 118/49.1 |
| 4,218,495 | 8/1980 | Takagi et al. | 204/192.31 X |
| 4,354,909 | 10/1982 | Takagi et al. | 204/192.31 |
| 4,687,939 | 8/1987 | Miyauchi et al. | 204/192.31 X |
| 4,805,555 | 2/1989 | Itoh | 118/719 |
| 4,811,690 | 3/1989 | Kawagoe et al. | 118/723 |
| 4,902,572 | 2/1990 | Horne et al. | 204/192.31 X |

FOREIGN PATENT DOCUMENTS 63-179060  7/1988  Japan .
8806637  9/1988  PCT Int'l Appl. .

*Primary Examiner*—Nam Nguyen
*Attorney, Agent, or Firm*—Leydig, Voit & Mayer

[57] ABSTRACT

An apparatus for forming a thin film includes a vacuum chamber; an exhaust system for evacuating the vacuum chamber and a crucible for generating, in the vacuum chamber, clusters of a deposit substance. The apparatus for forming a thin film further includes an ionizing device for ionizing part of the clusters generated by the crucible; an acceleration device for accelerating ionized clusters to collide with a substrate retained in the vacuum chamber; and a filter for removing ionized clusters smaller than a predetermined size.

4 Claims, 3 Drawing Sheets

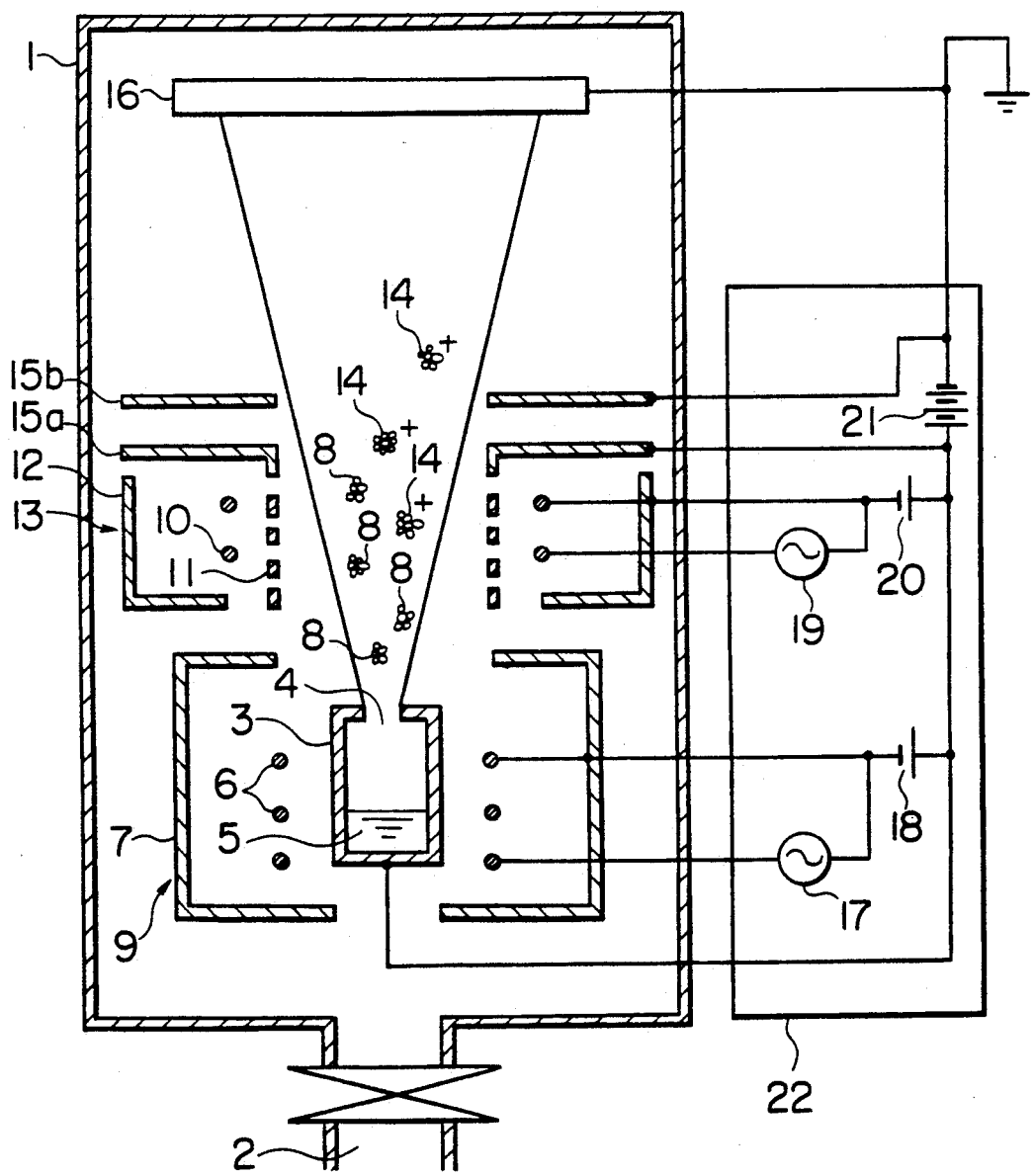

APPARATUS FOR FORMING THIN FILM

BACKGROUND OF THE INVENTION

1. Field of the Invention

The present invention relates to an apparatus for forming a thin film, and more particularly to an apparatus for forming a high-quality thin film by means of an ionized-cluster beam deposition (ICB) method.

2. Description of the Related Art

FIG. 3 is a schematic representation showing a conventional apparatus for forming a thin film disclosed, for example, in Japanese Patent Publication No. 54-9592. The apparatus for forming a thin film has a vacuum chamber 1 to keep its vacuum to a predetermined degree less than $10^{-4}$ Torr. A vacuum exhaust system 2 is connected to the vacuum chamber 1 in order to evacuate the vacuum chamber 1.

A crucible 3 is arranged inside the vacuum chamber 1, this crucible 3 for generating clusters of a substance 5 in the crucible by vaporizing the substance 5. A nozzle 4 is provided over the crucible 3.

Furthermore, the crucible 3 is filled with the substance 5, and heating filaments 6 are arranged surrounding the crucible 3.

Moreover, a heat shielding plate 7 is disposed outside the heating filaments 6 so as to intercept the heat from the heating filaments 6. A vapor source 9 includes the crucible 3, the heating filaments 6 and the heat shielding plate 7.

What is indicated by numeral 8 are clusters (massive atom groups) which are formed by evaporating the substance 5 through the nozzle 4 arranged over the crucible 3.

Ionization filaments 10, which emit electrons for ionization of ions, are arranged over the crucible 3. An electron beam drawing electrode 11 is disposed inside the ionization filaments 10 so as to draw electrons from the ionization filaments 10 and accelerate them.

Furthermore, a heat shielding plate 12 is arranged outside the ionization filaments 10 so as to intercept the heat of the ionization filaments 10. An ionizing means 13 includes the ionization filaments 10, the electron beam drawing electrode 11, and the heat shielding plate 12.

In addition, an acceleration electrode 15a and a ground electrode 15b are arranged over the ionizing means 13. The acceleration electrode 15a and the ground electrode 15b comprise an acceleration means which accelerates, in an electric field, clusters 14 ionized by the ionizing means 13 in order to provide the ionized clusters 14 with kinetic energy. A substrate 16, on which a thin film is deposited, is disposed over the acceleration electrode 15a and the ground electrode 15b.

A first AC power supply 17 is connected to the heating filaments 6 mentioned above. A first DC power supply 18 is also connected to the heating filaments 6, this first DC power supply 18 causing the electric potential of the crucible 3 to be positively biased with respect to the heating filaments 6.

Moreover, a second AC power supply 19 is connected to the above-mentioned ionization filaments 10. A second DC power supply 20 is also connected to the ionization filaments 10, this second DC power supply 20 causing the ionization filaments 10 to be negatively biased with respect to the electron beam drawing electrode 11.

In addition, a third DC power supply 21 is connected to the crucible 3, the electron beam drawing electrode 11, and the acceleration electrode 15a. The third DC power supply 21 causes the crucible 3, the electrodes 11 and 15a to be positively biased with respect to the ground electrode 15b. The first AC power supply 17, the first DC power supply 18, the second AC power supply 19, the second DC power supply 20, and the third DC power supply 21 are all housed in a power supply device 22.

The operation of the apparatus for forming a thin film will be described hereinafter.

The vacuum chamber 1 is evacuated by the vacuum exhaust system 2 to approximately $10^{-6}$ Torr.

Electrons emitted from the heating filaments 6 are drawn out by the electric field applied by the first DC power supply 18. These drawn electrons collide with the crucible 3 to heat it until the vapor pressure in the crucible 3 reaches several Torr.

This heating evaporates the substance 5 in the crucible 3, whereby the substance 5 is injected into the vacuum chamber 1 through the nozzle 4.

The vapor of the substance 5, when passing through the nozzle 4, is accelerated and cooled by means of adiabatic expansion, and is condensed to form the clusters 8.

The second DC power supply 20 causes the ionization filaments 10 heated by the second AC power supply 19 to be negatively biased with respect to the electron beam drawing electrode 11, whereby thermionic electrons emitted from the ionization filaments 10 are introduced into the inside of the electron beam drawing electrode 11.

The clusters 8 then turn into ionized clusters 14 due to ionization by the electron beam emitted from the ionization filaments 10.

The third DC power supply 21 causes the crucible 3, the electron beam drawing electrode 11, and the acceleration electrode 15a to be positively biased with respect to the ground electrode 15b in a ground electric potential. The acceleration of the ionized clusters 14, together with neutral clusters 8 which are not yet ionized, is controlled by means of an electric field lens formed between the acceleration electrode 15a and the ground electrode 15b. The ionized clusters 14 collide, after being accelerated, with the surface of the substrate 16 to form a thin film.

As has been described above, in the conventional apparatus for forming a thin film, the properties of the thin films formed are controlled by providing the ionized clusters 14 and by controlling the kinetic energy of the clusters 14. For this reason, to form homogeneous thin films, it is necessary to lessen the variations in the kinetic energy of the atoms of an ionized cluster beam which collides with the surface of the substrate 16. It is also required that an appropriate quantity of the ionized clusters 14 collide with the substrate 16. This quantity is maintained by altering the acceleration voltage applied by the third DC power supply 21.

When there are variations in the sizes of the clusters, there are also variations in the kinetic energy of the atoms colliding with the surface of the substrate 16.

For example, when a voltage of 600 V is applied to the third DC power supply 21 to accelerate the ionized clusters 14, the ionized clusters 14, each composed of two atoms, collide with the substrate 16, with each atom having an energy of 300 V. At the same voltage, on the other hand, the ionized clusters 14, composed of three, four, and five atoms, collide with the substrate 16, with each atom having an energy of 200 V, 150 V, and 120 V, respectively.

When a single atom which is not formed into a cluster is ionized, it is accelerated with an energy of 600 V.

As mentioned above, there is a problem in that it is impossible to form homogeneous thin films when the kinetic energy of the atoms constituting the clusters which impinge upon the substrate 16 is not uniform.

There is also a problem in that the collisions of small ionized clusters and ionized atoms against the substrate 16 cause damage to the substrate 16 because of the large amount of the kinetic energy at the collision.

As the acceleration voltage varies, so does the amount of ionized clusters drawn. The quantity of such ions is proportional to the 1.5th power of the acceleration voltage, according to the Child-Langmuir equation.

Thus, when the acceleration voltage in particular is made small so as to control the properties of the thin films, the quantity of ionized clusters reaching the substrate 16 greatly diminishes. This results in a problem in that it is impossible to form high-quality thin films by making use of the properties of the ionized clusters.

There is also a problem in that as the acceleration voltage approaches 0, electrons flying out of the ionization filaments 10 impinge upon the substrate 16, thereby causing damage to the substrate 16.

SUMMARY OF THE INVENTION

The present invention has been accomplished to solve the foregoing problems. Accordingly, an object of the invention is to provide an apparatus for forming high-quality and homogeneous thin films.

In order to achieve the above object, according to the present invention, there is provided an apparatus for forming a thin film comprising: a vacuum chamber; exhaust means for evacuating the vacuum chamber; cluster generating means for generating, in the vacuum chamber, clusters of a substance; ionizing means for ionizing part of the clusters generated by the cluster generating means; acceleration means for accelerating both clusters ionized by the ionizing means and clusters not yet ionized to allow both types of clusters to collide with a substrate retained in the vacuum chamber; and filter means for removing ionized clusters smaller than a predetermined size.

BRIEF DESCRIPTION OF THE DRAWINGS

FIG. 3 is a cross-sectional view showing the conventional apparatus for forming a thin film.

DESCRIPTION OF THE PREFERRED EMBODIMENTS

The embodiments of the present invention will now be described with reference to the accompanying drawings.

Figure 1:
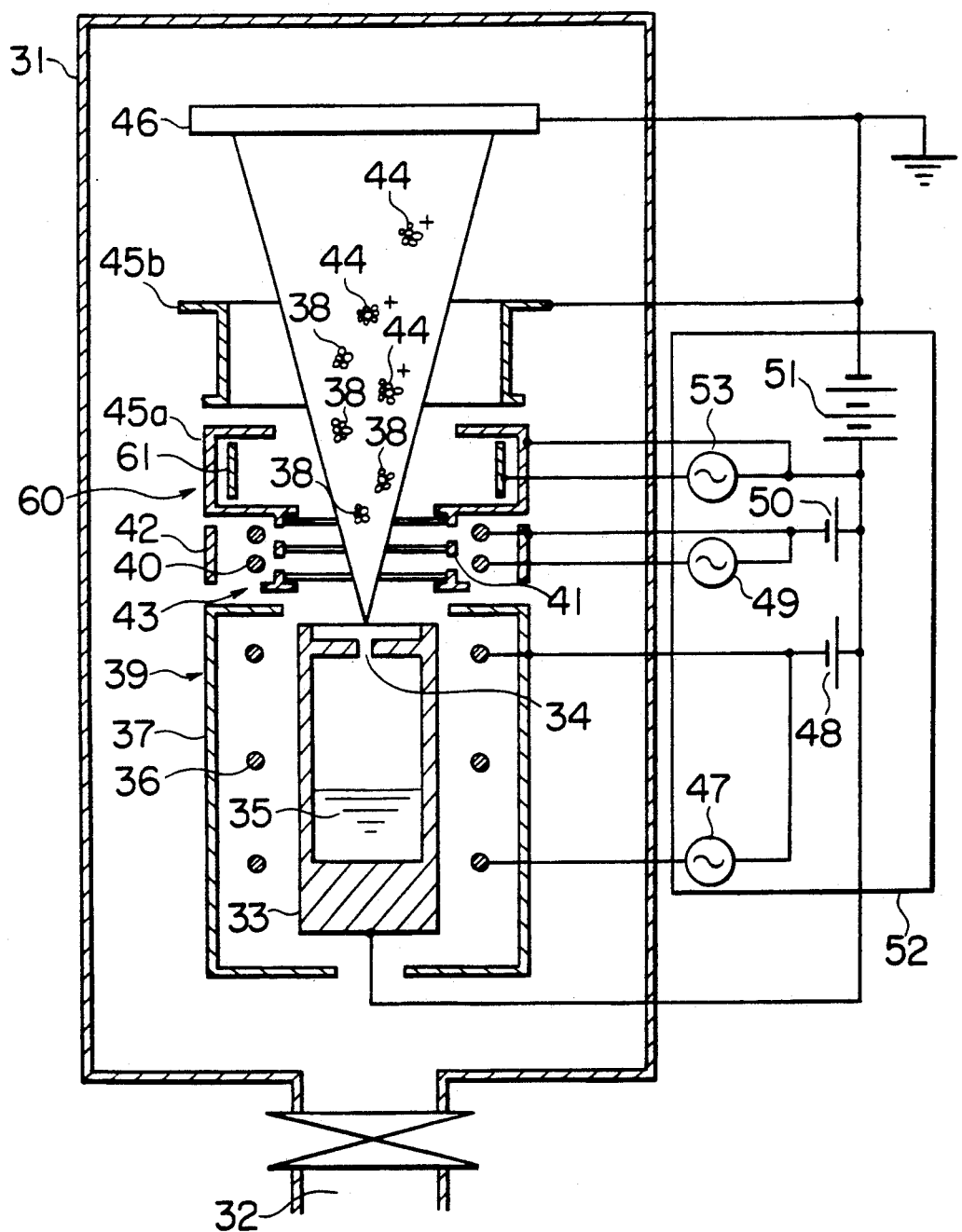
FIG. 1 is a cross-sectional view showing an embodiment of an apparatus according to the present invention for forming a thin film.

In FIG. 1, an apparatus for forming a thin film of the invention has a vacuum chamber 31 to keep its vacuum to a predetermined degree. A vacuum exhaust system 32 is connected to the vacuum chamber 31 to evacuate the vacuum chamber 31.

A crucible 33 is arranged inside the vacuum chamber 31, this crucible 33 being used for generating the clusters of a substance 35 in the crucible by vaporizing the substance 35. A nozzle 34 is provided over the crucible 33.

Furthermore, the crucible 33 is filled with the substance 35, and heating filaments 36 are arranged surrounding the crucible 33.

Moreover, a heat shielding plate 37 is disposed outside the heating filaments 36 so as to intercept the heat from the heating filaments 36. A vapor source 39 comprises the crucible 33, the heating filaments 36 and the heat shielding plate 37.

What is indicated by numeral 38 are clusters (massive atom groups) which are formed by vaporizing the substance 35 through the nozzle 34 arranged over the crucible 33.

Ionization filaments 40, which emit an electron beam, are arranged over the crucible 33. An electron beam drawing electrode 41 is disposed inside the ionization filaments 40 so as to draw electrons from the ionization filaments 40 and accelerate them.

Furthermore, a heat shielding plate 42 is arranged outside the ionization filaments 40 so as to intercept the heat of the ionization filaments 40. An ionizing means 43 comprises the ionization filaments 40, the electron beam drawing electrode 41, and the heat shielding plate 42.

Moreover, a filter 60, composed of a pair of opposed electrodes 61, is arranged over the ionizing means 43 for removing small-sized clusters. A high-frequency power supply 53, for applying a high-frequency voltage, is connected to the opposed electrodes 61.

In addition, an acceleration electrode 45a and a ground electrode 45b are arranged over the filter 60. The acceleration electrode 45a and the ground electrode 45b comprise an acceleration means which accelerates, in an electric field, clusters 44 ionized by the ionizing means 43 in order to provide the ionized clusters 44 with kinetic energy. A substrate 46, on which a thin film is formed, is disposed over the acceleration electrode 45a and the ground electrode 45b.

A first AC power supply 47 is connected to the heating filaments 36 mentioned above. A first DC power supply 48 is also connected to the heating filaments 36, this first DC power supply 48 causing the crucible 33 to be positively biased with respect to the heating filaments 36.

Moreover, a second AC power supply 49 is connected to the above-mentioned ionization filaments 40. A second DC power supply 50 is also connected to the ionization filaments 40, this second DC power supply 50 causing the ionization filaments 40 to be negatively biased with respect to the electron beam drawing electrode 41.

In addition, a third DC power supply 51 is connected to the crucible 33, the electron beam drawing electrode 41, and the acceleration electrode 45a. The third DC power supply 51 causes the above crucible 33, the electron beam drawing electrode 41, and the acceleration electrode 45a to be positively biased with respect to the ground electrode 45a. The first AC power supply 47, the first DC power supply 48, the second AC power supply 49, the second DC power supply 50, the third DC power supply 51, and the high-frequency power supply 53 are all housed in a power supply device 52.

The operation of the embodiments of the present invention will be described hereinafter.

The vacuum chamber 31 is evacuated by the vacuum exhaust system 32 to approximately $10^{-6}$ Torr.

Electrons emitted from the heating filaments 36 are drawn out by the electric field applied by the first DC power supply 48. These drawn electrons collide with the crucible 33 to heat it until the vapor pressure in the crucible 33 reaches several Torr.

This heating evaporates substance 35 in the crucible 33, whereby the substance 35 is injected into the vacuum chamber 31 through the nozzle 34.

The vapor of substance 35, when passing through the nozzle 34, is accelerated and cooled by means of adiabatic expansion, and is condensed to form the clusters 38.

The second DC power supply 50 causes the ionization filaments 40 heated by the second AC power supply 49 to be negatively biased with respect to the electron beam drawing electrode 41, whereby thermionic electrons emitted from the ionization filaments 40 are introduced into the inside of the electron beam drawing electrode 41.

The clusters 38 then turn into ionized clusters 44 due to ionization by the electron beam emitted from the ionization filaments 40.

Upon application of a high-frequency voltage to the opposed electrodes 61 arranged over the ionizing means 43, the ionized clusters 44 are deflected because of the opposed electrodes 61.

The amount of this deflection depends on the number of atoms which constitute a cluster: the smaller the number of atoms, the more the ionized clusters 44 are deflected. For this reason, as the high-frequency voltage applied from the high-frequency power supply 53 increases, one-atom ions and small ionized clusters 44 collide with the opposed electrodes 61 and as a result are removed.

By adjusting the threshold of the high-frequency voltage, it is thus possible for the ionized clusters 44 which are smaller than a predetermined size to be removed by collision with the opposed electrodes 61.

For example, on the one hand, when an acceleration voltage of 600 V is applied to form a film under the conditions where the ionized clusters 44, composed of 10 atoms or less, are removed, the kinetic energy of the atoms, which atoms constitute the ionized clusters 44 impinging upon the substrate 46, is 60 V or less. On the other hand, when the threshold of a voltage to be applied is increased to form a film where the ionized clusters 44, composed of 60 atoms or less, are removed, the kinetic energy of the atoms is 10 V or less.

The third DC power supply 51 causes the crucible 33, the electron beam drawing electrode 41, and the acceleration electrode 45a to be positively biased with respect to the ground electrode 45b at ground potential. The acceleration of the ionized clusters 44, together with the neutral clusters 38 which are not yet ionized, is controlled by means of an electric field lens formed between the acceleration electrode 45a and the ground electrode 45b. Those clusters then collide with the surface of the substrate 46 to form a thin film.

The high-frequency voltage applied to the opposed electrodes 61 may be applied in any manner, so long as it deflects the ionized clusters 44. It may be applied, for example, in a pulse-like manner, or it may be steadily applied.

Figure 2:
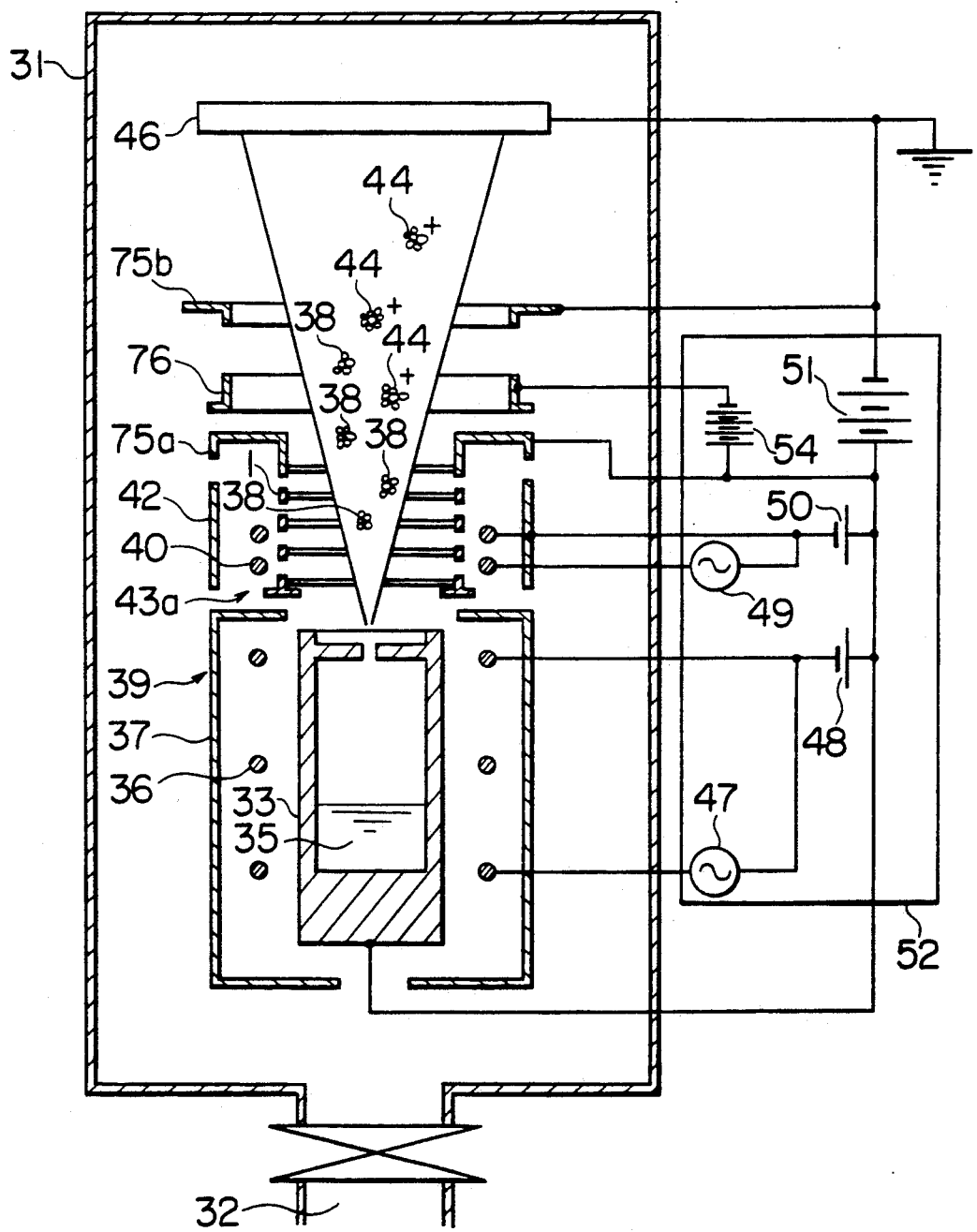
FIG. 2 is a cross-sectional view showing another embodiment of the apparatus according to the invention for forming a thin film.

In the above-described embodiment, though the acceleration means is composed of the acceleration electrode 45a and the ground electrode 45b, it is not limited to such a construction. As shown in FIG. 2, the acceleration means may be composed of a positively biased acceleration electrode 75a, a drawing electrode 76 which is negatively biased with respect to the acceleration electrode 75a, and a grounded electrode 75b. Numeral 54 denotes a fourth DC power supply which causes the drawing electrode 76 to be negatively biased with respect to the acceleration electrode 75a.

Since the fourth DC power supply 54 has a terminal voltage higher than that of the third DC power supply 51, the drawing electrode 76 is always negatively biased with respect to the ground electrode 75b.

In such a case, when voltage is applied by the fourth DC power supply 54 to the space between the acceleration means 75a and the drawing electrode 76, both of which are arranged over the ionizing means 43a, the ionized clusters 44 are accelerated by this voltage and drawn toward the substrate 46.

While the ionized clusters 44 are drawn toward the substrate 46, because the drawing electrode 76 is negatively biased with respect to the ground electrode 75b, the drawn ionized clusters 44 are decelerated and consequently impinge upon the substrate 46 with energy equal to the potential difference (acceleration voltage) between the acceleration electrode 75a applied by the third DC power supply 51 and the ground electrode 75b.

If the voltage between the acceleration electrode 75a and the ground electrode 75b is made constant, even when the acceleration voltage is altered, it is thus possible to secure a quantity of the ionized clusters 44 which can be drawn, to a level higher than a required level. As a result, even when a small amount of the acceleration voltage is applied, it is possible to make use of the properties of the ionized clusters 44 to form thin films.

For instance, when the terminal voltage of the fourth DC power supply 54 is 3000 V and it is desired that the acceleration voltage be 500 V, setting the electric potential of the drawing electrode 76 to $-2500$ V is sufficient. When it is desired that the acceleration voltage be 50 V, setting the electric potential of the drawing electrode 76 to $-2950$ V is sufficient. The ground electrode 75b remains at 0 V.

Since the drawing electrode 76 is always negatively biased with respect to the grounded substrate 46, it inhibits electrons from the ionization filaments 40 from impinging upon the substrate 46.

As has been described above, according to the present invention, because of the removal of the small-sized ionized clusters by the filter, it is possible to form high-quality thin films by lessening variations in the kinetic energy of the atoms constituting the clusters which collide with the substrate. It is also possible to control the properties of the thin films by altering the kinetic energy of the atoms constituting the clusters.

In addition, when an acceleration means includes a positively biased acceleration electrode, a drawing electrode negatively biased with respect to the positively biased acceleration electrode, and a grounded ground electrode, even with a small amount of an acceleration voltage, it is possible to irradiate ionized clusters in a required quantity to form thin films. It is also possible to control the impingement of electrons upon the substrate, and to prevent the substrate from being damaged.

What is claimed is:

1. An apparatus for forming a thin film comprising:
a vacuum chamber;
exhaust means for evacuating said vacuum chamber;

cluster generating means for generating, in said vacuum chamber, clusters of a substance;

ionizing means for ionizing clusters generated by said cluster generating means;

acceleration means for accelerating clusters ionized by said ionizing means to collide with a substrate retained in said vacuum chamber, said acceleration means including a tubular ground electrode and a tubular acceleration electrode for being positively biased with respect to said ground electrode; and filter means for removing and preventing ionized clusters smaller than a predetermined size from colliding with the substrate, said filter means including a pair of opposed electrodes disposed within the tubular acceleration electrode for deflecting ionized clusters.

2. An apparatus for forming a thin film as claimed in claim 1 includes a high-frequency power supply for supplying voltage to said opposed electrodes.

3. An apparatus for forming a thin film as claimed in claim 1 wherein said cluster generating means includes a crucible in which a substance is disposed and including a nozzle for injecting a vapor of the substance into the vacuum chamber, and heating means for heating said crucible to evaporate the substance.

4. An apparatus for forming a thin film as claimed in claim 1 wherein said ionizing means includes ionization filaments for emitting electrons, and a drawing electrode for accelerating electrons emitted from said ionization filaments to collide with the clusters.

* * * * *